United States Patent
Ettehadieh et al.

Patent Number: 6,081,028
Date of Patent: *Jun. 27, 2000

[54] THERMAL MANAGEMENT ENHANCEMENTS FOR CAVITY PACKAGES

[75] Inventors: Ehsan Ettehadieh, Albany; Sunil Kaul, Fremont; Dev Malladi, Campbell, all of Calif.

[73] Assignee: Sun Microsystems, Inc., Mountain View, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/514,390

[22] Filed: Aug. 11, 1995

Related U.S. Application Data

[63] Continuation of application No. 08/219,624, Mar. 29, 1994, abandoned.

[51] Int. Cl.$^7$ .................................................. H01L 23/42
[52] U.S. Cl. .......................... 257/713; 257/687; 257/707
[58] Field of Search ................................. 257/687, 713, 257/717, 712, 707; 438/122

[56] References Cited

U.S. PATENT DOCUMENTS

| | | | |
|---|---|---|---|
| 4,000,509 | 12/1976 | Jurvela | 257/697 |
| 4,641,176 | 2/1987 | Keryhuel et al. | 257/687 |
| 4,763,407 | 8/1988 | Abe | 257/687 |
| 4,812,897 | 3/1989 | Narita et al. | 257/687 |
| 4,819,041 | 4/1989 | Redmond | 257/687 |
| 4,876,588 | 10/1989 | Miyamoto | 257/717 |
| 4,887,148 | 12/1989 | Mu | 257/664 |
| 4,901,137 | 2/1990 | Sato et al. | 257/717 |
| 4,914,551 | 4/1990 | Anschel et al. | 257/717 |
| 4,965,660 | 10/1990 | Ogihara et al. | 257/717 |
| 5,175,613 | 12/1992 | Barker, III et al. | 257/717 |
| 5,184,211 | 2/1993 | Fox | 257/717 |
| 5,216,283 | 6/1993 | Lin | 257/717 |
| 5,455,457 | 10/1995 | Kurokawa | 257/712 |

*Primary Examiner*—John Guay
*Attorney, Agent, or Firm*—Blakely Sokoloff Taylor & Zafman

[57] ABSTRACT

A thermal conducting material for providing lateral thermal conduction across a surface of an integrated circuit and for enhancing thermal dissipation from the integrated circuit. The integrated circuit is incorporated within a semiconductor device having a cavity package. A layer of the thermal conducting material, preferably electrically non-conductive, is disposed on a surface of an integrated circuit in the form of a die to provide lateral heat conduction to reduce the number of hot spots within the integrated circuit. Alternatively, the thermal conducting, electrically non-conductive material may be used to fill a cavity within the cavity package so that the cavity package dissipates heat in a more effective manner.

16 Claims, 3 Drawing Sheets

THERMAL MANAGEMENT ENHANCEMENTS FOR CAVITY PACKAGES

This is a continuation of Application Ser. No. 08/219,624 filed Mar. 29, 1994, now abandoned.

BACKGROUND OF THE INVENTION

1. Field of the Invention

The present invention relates to an apparatus and method for thermal management of semiconductor devices. More specifically, the present invention relates to a thermal conducting material which provides uniformity and improves thermal dissipation by the integrated circuit.

2. Background of the Invention

In recent years, there has been many advances in integrated circuit technology, especially in semiconductor devices. A semiconductor device is an integrated circuit in packaged form, operating as a processing unit, memory, controller or any other electronic device. The package and packaging techniques currently being used for these semiconductor devices are designed to protect the integrated circuit from damage, to provide electrical connection between the integrated circuit and external electrical devices and, most relevant to the scope of this application, to provide adequate thermal dissipation during operation. These conventional packages include a variety of packages having cavities therein, such as a Ball Grid Array ("BGA"), a Pin Grid Array ("PGA"), a Land Grid Array ("LGA") and other similar packages (hereinafter collectively referred to as a "cavity package").

As shown in FIG. 1, the conventional semiconductor device 1 comprises an integrated circuit die 2, the die 2 being sealed within a cavity 4 of a cavity package 3, such as a PGA package in this embodiment. The cavity package 3 is coupled to a printed circuit board 9 (e.g., a peripheral card, a motherboard and the like) by conventional techniques known in the art to enable the die 2 to operate within the computer system. The die 2 is bordered along its perimeter by a plurality of cavity side walls such that side walls 4a and 4b border opposite sides of the die 2. The die 2 is further bordered along a top portion 3b of the package cavity 3 by a package lid 5. In accordance with industry standards, the top portion 3b of the cavity package 3 is that surface directly opposite the printed circuit board 9 when the semiconductor device 1 is coupled thereto and a bottom portion 3a is that surface furthest away from the printed circuit board 9.

During operation, the die 2 consumes power and generates heat as a byproduct. Unfortunately, the die 2 does not generate heat in a uniform manner along its surface. Rather, the die 2 typically has a surface temperature varying from one location to another by as much as 25° Celsius. The locations having these higher temperatures, referred to as "hot spots", which decrease die reliability and reduce the useful life of the die 2 by accelerating time-temperature failure mechanisms (i.e., increasing transistor leakage) at the hot spots over what they would be at a lower, average temperature for the entire die. Moreover, these hot spots cause otherwise identical devices to exhibit different operating parameters and to age differently because of the different temperatures thereof, thereby raising the probability of early and unpredictable out of operating range device parameters for the integrated circuit in question. Attempts to reduce the number of hot spots have been directed to minimizing current density per unit area of the die 2 as well as providing reliable thermal dissipation.

Typically, for lower power consumption semiconductor devices as shown in FIG. 1, thermal dissipation is be accomplished by transferring the heat from the die 2, through a heat conductive gaseous medium (e.g., air) within the cavity 4, to the cavity package 3. Thereafter, the cavity package 3 dissipates the heat to an atmosphere surrounding the cavity package 3. However, for higher power consumption semiconductor devices, the cavity package 3 is incapable of providing adequate thermal dissipation by itself.

Referring to FIG. 2, a conventional thermal transfer device 6 to be embedded into the bottom portion 3a of the cavity package 3 proximate to the die 2 is shown. Currently, the most cost-effective thermal transfer device 6 is a heat slug 7 in combination with a larger heat sink 8. The heat slug 7 is molded proximate to the die 2 in the bottom portion 3a of the chip package 3 in order to conduct heat from the die 2. Since the heat slug 7 has negligible surface area exposed to the surrounding atmosphere, not suitable for optimal thermal dissipation, the heat sink 8 is commonly mounted onto the heat slug 7 for thermal dissipation purposes.

Recently, technological advances in the semiconductor industry have led to "improved" semiconductor devices which have larger chip sizes and operate at higher clock frequencies. As a result, these improved semiconductor devices consume more power than previous generation semiconductor devices, and therefore, require greater thermal dissipation to operate at a desired temperature. It is now being discovered that the heat slug 7 and heat sink 8 is incapable of providing adequate thermal dissipation to many improved semiconductor devices. Thus, the semiconductor industry is being forced to adopt more expensive alternative thermal transfer devices, resulting in a more costly final product for the consumer.

Hence, it would be desirable to develop an apparatus and method for enhancing thermal dissipation so as to eliminate the need for a heat slug/sink combination in some cases, and especially costly alternative thermal transfer devices.

BRIEF SUMMARY OF THE INVENTION

In light of the foregoing, it will be apparent that there exists a need for an apparatus and method for reducing thermal dissipation requirements in order to eliminate thermal transfer devices in certain situations, or alternatively, to allow implementation of the most cost-effective thermal transfer devices in other situations.

In accordance with the present invention, the apparatus for accomplishing the above-identified need is a layer of thermal conducting material disposed along an outer surface of the integrated circuit which is normally metal interconnects for the integrated circuit. The thermal conducting material is also electrically non-conductive, thereby preventing any adverse effects on the operation of the integrated circuit. As a result, the thermal conducting material provides lateral heat conduction across the integrated circuit to provide a more uniform temperature across the integrated circuit. This reduces the number of hot spots throughout the integrated circuit so that the semiconductor device is more reliable, has a greater useful life, and may not require a thermal transfer device or at least a less costly one.

Alternatively, the thermal conducting material could be substituted for the gaseous medium within the cavity to enhance thermal conduction to the package and connections with the printed circuit board as well as reducing hot spots across the surface of the die as discussed above.

The method for regulating thermal dissipation comprises the steps of (i) coating the integrated circuit with thermal conducting material (ii) mounting the integrated circuit within the semiconductor device package having a cavity herein and (iii) sealing the semiconductor device package. It is contemplated as an alternative method could be used wherein the integrated circuit is coated with the thermal conducting material after and not before the mounting step, or the cavity of the semiconductor device package could be filled with thermal conducting material after mounting the integrated circuit within the semiconductor device package in lieu of the coating step.

BRIEF DESCRIPTION OF THE DRAWINGS

The features and advantages of the present invention will become apparent from the following detailed description of the present invention in which.

DETAILED DESCRIPTION OF THE INVENTION

An apparatus and method are described for providing sufficient thermal dissipation for a semiconductor device which, in return, promotes better reliability of and faster processing speeds by the semiconductor device during normal operations. In the following detailed description, numerous specific details are set forth, such as a specific ingredients of the thermal conducting material. It is apparent, however, to one skilled in the art that the present invention may be practiced without incorporating these precise ingredients.

Figure 1:
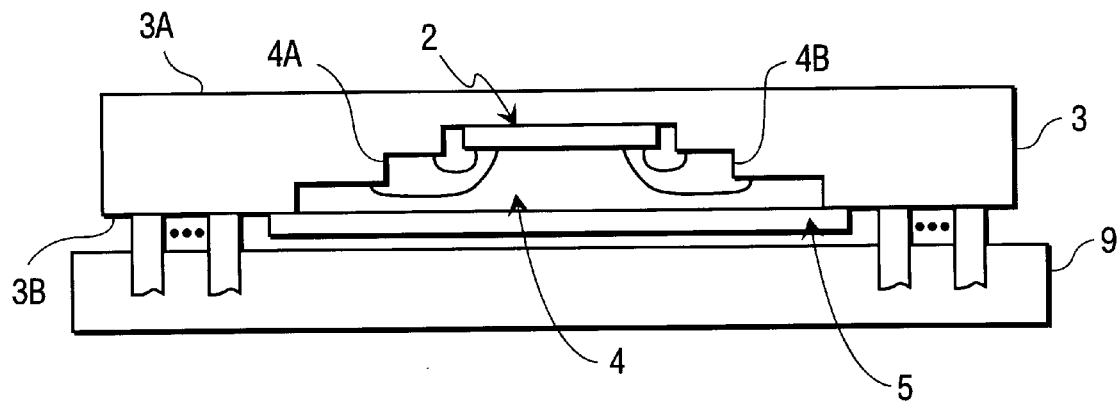
FIG. 1 is a cross sectional view of a conventional prior art cavity package.
Figure 2:
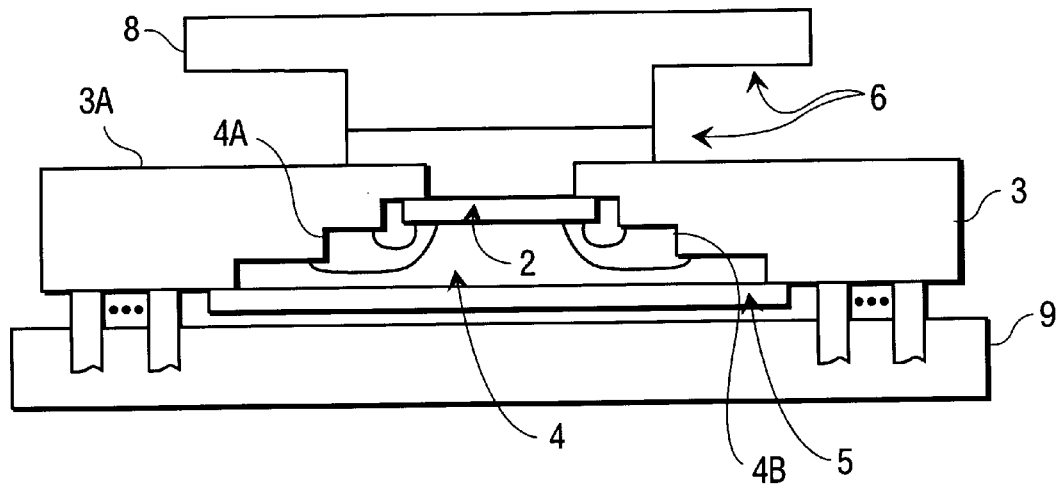
FIG. 2 is a cross sectional view of a conventional prior art cavity package having a thermal transfer device.
Figure 3:
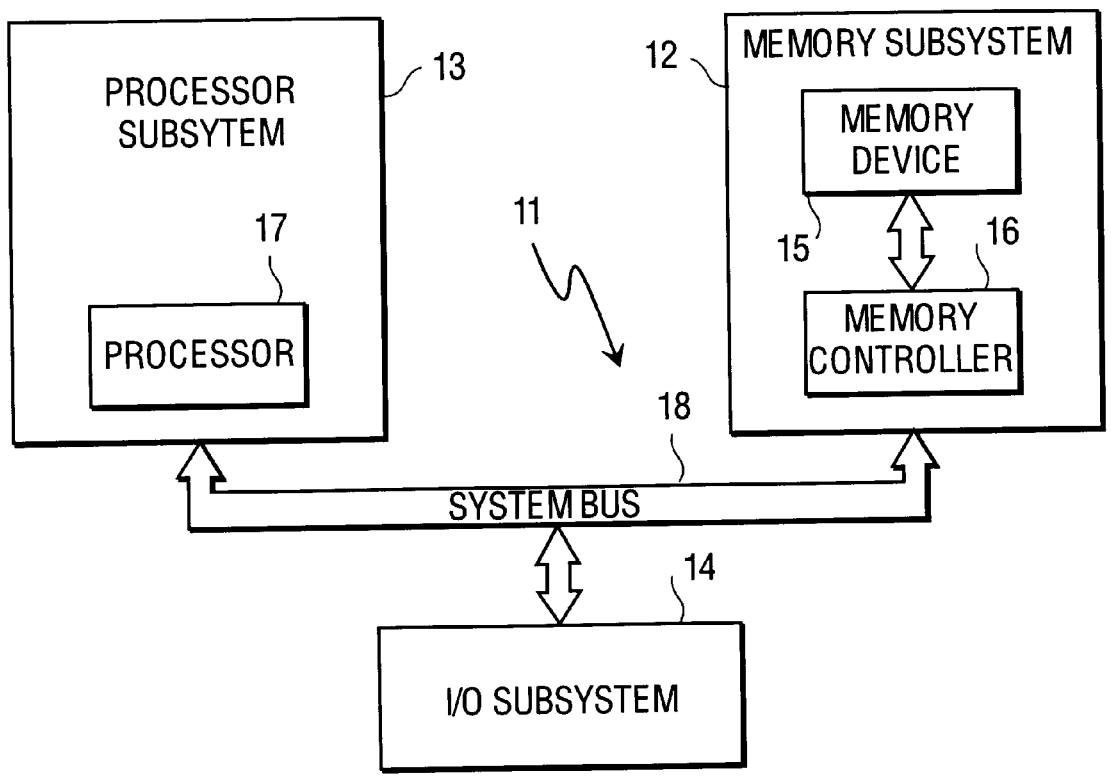
FIG. 3 is a computer system comprising three components, any of which incorporating the present invention.

Referring to FIG. 3, a typical computer system 11 comprises a memory subsystem 12, a processor subsystem 13 and an input/output ("I/O") subsystem 14, each of which comprises one or more semiconductor devices. The memory subsystem 12 includes at least main memory 15 (e.g., dynamic random access memory "DRAM", random access memory "RAM", read only memory "ROM", video random access memory "VRAM" and the like) which is used to store information in the form of software programs, data and other information for use by the processing subsystem 13. The memory subsystem may include a memory controller 16 (as shown) for providing an interface between the processing subsystem 13 and the main memory 15 to control access thereto.

The processing system 13 is a uni-processor or multi-processor system thereby including at least one processor 17 to receive information from the main memory 15 through a bus 18 coupling the memory subsystem 12 to the processing subsystem 13, or alternatively, through the I/O subsystem 14 which may include a variety of I/O devices relying on semiconductor devices such as an alphanumeric keyboard, mouse, printed, etc. These semiconductor devices requires power to operate and thus, generate heat as a by-product. The heat is dissipated from the semiconductor device(s) for reliability since inadequate removal of the heat dissipated by the processor 17 or the main memory 15 causes the computer system 11 to become inoperative.

Figure 4:
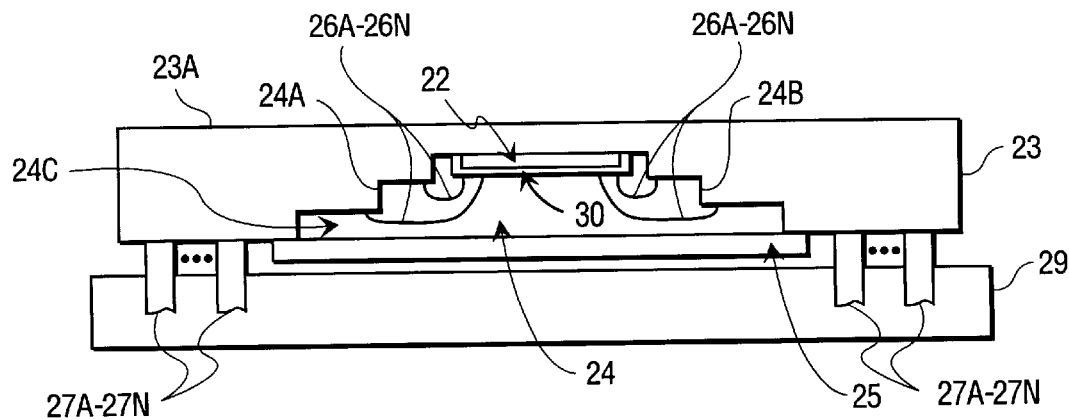
FIG. 4 is a cross sectional view of a first embodiment of the present invention in which a thermal conducting material is disposed on an outer surface of the die.

Referring now to FIG. 4, for lower power consumption semiconductor devices, the semiconductor device 21 comprises a semiconductor device package 23 having a cavity 24 for housing and protecting an integrated circuit in the form of a die 22, for example metal-oxide semiconductor ("MOS") construction such as BiCMOS and CMOS. The die 22 is sealed, preferably hermetically, within the cavity 24 of the semiconductor device package 23 by at least a package lid 25 and a plurality of cavity side walls of which only side walls 24a and 24b are illustrated in this cross-sectional view. The side walls which are not illustrated, are interposed and positioned perpendicular to a direction of the opposite side walls 24a and 24b. It is contemplated that the present invention may be used for any type of semiconductor device package, but is preferably used in connection with packages having a cavity therein.

A plurality of wire bonds 26a–26m are mechanically and electrically coupled to the die 22 within the cavity 24. The wire bonds 26a–26m (where "m" is a first arbitrary number) are coupled to a plurality of leads 27a–27n (where "n" is a second arbitrary number identical or different from the first arbitrary number) formed to extend beyond the cavity package 24 in order to provide an electrical coupling between the die 22 and a printed circuit board 29. The plurality of leads 27a–27n are attached to the printed circuit board 29 through conventional means such as solder. The printed circuit board 29 is normally a peripheral card or a motherboard coupled to a backplane of a computer system in order to provide electrical coupling of the die 22 so as to operate within the computer system.

The semiconductor device package 23 is made of a material resistant to temperatures below approximately 185° Celsius, such as, for example, Bismaleimide Triazine, in order to prevent the semiconductor device package 23 from melting during extraordinary operation temperatures or normal reflow conditions. The package lid 25, which is made of any temperature-resistant, hardened material such as plastic or ceramic, is placed along an opening 24c of the cavity 24 to protect the die 22 from contaminants and other external harmful elements.

As previously stated, the die 22 experiences a non-uniform surface temperature ("hot spots") during operation. This is due to the fact that the surface temperature is correlated to its current density per unit area. Since different areas within the die 22 require different amounts of current to perform pre-selected functions, it is quite common for the surface temperature across the die 22 to vary from one location to another by as much as 25° Celsius. For speed and reliability concerns, however, the surface temperature of the die 22 needs to be as low and consistent as possible since fluxes of the surface temperature may cause reliability and speed problems. For example, it has been discovered that an increase in surface temperature of approximately 10° Celsius reduces the useful life of the semiconductor device by approximately one year. Moreover, for example, in a BiCMOS device, an increase in junction temperature of approximately 6° to 10° Celsius reduces its speed by approximately 1 megahertz.

As shown in FIG. 4, in order to provide a uniform surface temperature thereby reducing the peak temperature, the die 22 is coated with a thermal conducting material 30 being at least three millimeters and preferably ten millimeters in thickness and with conductivity of approximately 2–3 Watts/ meter ° C. The thermal conducting material 30 includes thermoset materials (e.g., epoxy, polyurethane and the like) or a silicone gel. Both the thermoset material and/or the silicone gel are filled with a high concentration of thermally conductive and electrically nonconductive materials including, but not limited to, diamond particles, alumina, aluminum nitride, silicon nitride, beryllium oxide and quartz. By including electrically non-conductive materials, the thermal conducting coating can be disposed on metal interconnects for the die 22, without adversely effecting the performance of the die 22. However, it is contemplated that the entire die 22 could be coated with the thermal conducting material 30.

In a preferred embodiment, the thermal conducting material includes at least thirty percent silicone gel and at most seventy percent electrically nonconductive material by weight. However, it is contemplated that the concentrations may vary in accordance to designer preference. Moreover, epoxy or polyurethane could be alternatively used in lieu of silicone gel.

Figure 5:
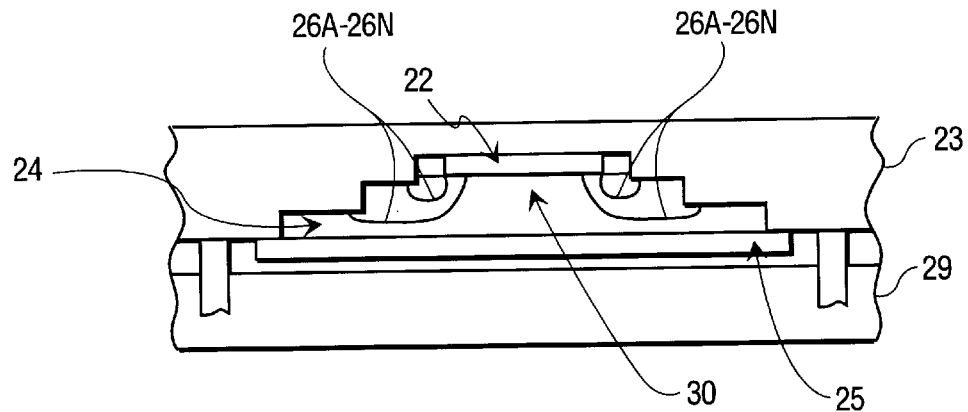
FIG. 5 is a cross sectional view of a second embodiment of the present invention in which a cavity of the semiconductor device package is filled with thermally conducting material to provide additional thermal dissipation paths.

As illustrated in FIG. 5, the same thermally conducting material 30 can be used to fill the cavity 24 and create additional thermal dissipation paths through the semiconductor device package 23 so that the semiconductor device package 23 will operate as a heat sink. Moreover, the interconnection elements such as the plurality of leads 27a–27n (i.e., pins, solder balls, etc.) from the semiconductor device package 23 to a printed circuit board 29 will provide additional cooling paths. Thus, in some cases, an additional thermal transfer device 31, such as a heat slug, is not necessary.

Figure 6:
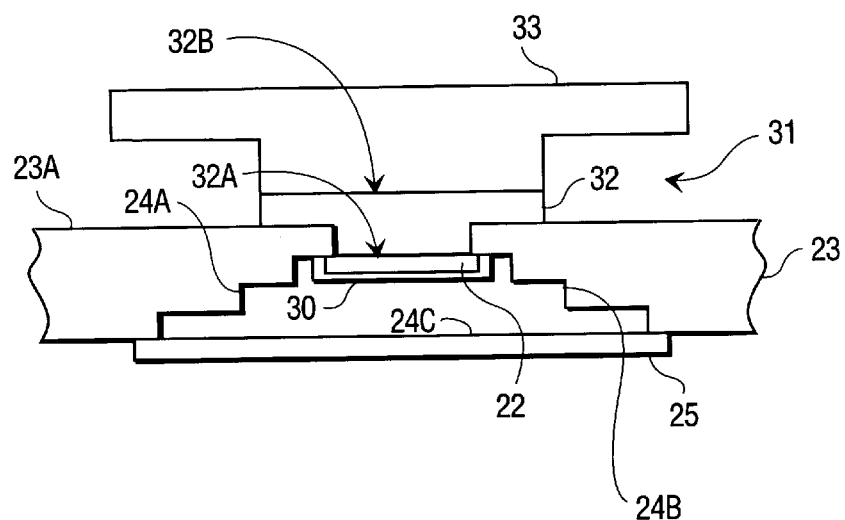
FIG. 6 is a cross sectional view of another embodiment of the present invention in which the semiconductor device of FIG. 4 includes a thermal transfer device coupled to the semiconductor device package.

In high power consumption semiconductor devices, such as bipolar devices requiring more thermal dissipation than provided by the semiconductor device package 23 itself, the thermal transfer device 31, shown in FIG. 6, is positioned along a bottom portion 23a of the cavity 24 to allow thermal dissipation from the die 22 once operation begins. In the preferred embodiment, the thermal transfer device 31 includes a heat slug 32 having a first surface 32a coupled to the die 22 and a second surface 32b coupled to a heat sink 33. It is contemplated, however, that there are many other alternative thermal transfer devices known in the art which provide greater thermal dissipation than the heat slug 32 and heat sink 33 combination and such as a heat pipe. Notwithstanding the fact that these alternative thermal devices are available, they are currently more expensive to make and therefore, less likely to be used.

The heat slug 32 is primarily used to conduct heat from the die 22 and the semiconductor package 23, and transfer such heat to the heat sink 33 for dissipation. Although it is contemplated that the heat slug 32 could be used with the present invention in order to dissipate heat, the heat sink 33 typically is used in combination with the heat slug 32 because the heat sink 33 is a better thermal dissipation device by having a greater surface area being exposed to air. Both the heat slug 32 and heat sink 33 are usually made of any thermal conducting material such as copper, which is an excellent thermal conductor. Other thermal conducting materials known in the art may be substituted for copper. In these semiconductor devices, the die 22 and/or cavity 24 is coated and/or filled with the thermal conducting, non-electrical conducing material in the same fashion as illustrated in FIGS. 4–5.

The following is a detailed description of the method for enhancing proper thermal dissipation from the semiconductor device as shown in FIGS. 4–6. The method comprises three steps. First, the integrated circuit is coated with the thermal conducting material. Next, the integrated circuit is placed with the semiconductor device package. Then, the integrated circuit is sealed within the chip package, preferably hermetically, to prevent damage to the integrated circuit. Alternatively, the first and second steps would be interchanged so that the coating is done after mounting the integrated circuit. Furthermore, as an alternative to coating the integrated circuit with the thermal conducting material, a cavity of the semiconductor device package could be filled with the thermal conducting material after the integrated circuit has been placed within the semiconductor device package, prior to the integrated circuit being sealed in the semiconductor device package.

The present invention described herein may be designed in many different methods and using many different configurations. While the present invention has been described in terms of various embodiments, other embodiments may come to mind to those skilled in the art without departing from the spirit and scope of the present invention. The invention should, therefore, be measured in terms of the claims which follows.

What is claimed is:

1. A semiconductor device comprising:
    a package having a ceramic lid covering a cavity having a predetermined depth;
    an integrated circuit placed within the package, the integrated circuit having a first surface including at least one wire bond attached thereto, and a layer of thermal conducting material disposed directly across the first surface of the integrated circuit to maintain the first surface of the integrated circuit at a substantially uniform surface temperature, a thickness of the layer of the thermal conducting material being less than one-half the depth of the cavity.

2. The semiconductor device according to claim 1, wherein the at least one wire bond is attached to a lead of the semiconductor device.

3. The semiconductor device according to claim 2, wherein the thermal conducting material is electrically non-conductive.

4. The semiconductor device according to claim 3, wherein the thermal conducting material is selected from a group consisting of diamond particles, alumina, aluminum nitride beryllium oxide and quartz.

5. The semiconductor device according to claim 3 further comprising a thermal transfer device affixed to the semiconductor device package, the thermal transfer device being proximate to a second surface of the integrated circuit.

6. The semiconductor device according to claim 5, wherein the thermal transfer device comprises a heat slug.

7. A computer system comprising a circuit board; and
    a semiconductor device coupled to the circuit board via a plurality of leads, the semiconductor device including a package having the plurality of leads and a cavity, an integrated circuit encapsulated within the cavity, and a ceramic lid covering the cavity, the integrated circuit having a layer of thermal conducting material disposed directly on a first surface of the integrated circuit including a plurality of wire bonds coupled to the plurality of leads the layer of thermal conducing material having a thickness less than one-half of a depth of the cavity in order to maintain a substantially uniform temperature across the first surface.

8. The computer system according to claim 7, wherein the thermal conducting material is electrically non-conductive.

9. The computer system according to claim 8, wherein the at least one semiconductor device is a processor for processing information.

10. The computer system according to claim 8, wherein the at least one semiconductor device is a memory element for storing information therein.

11. The computer system according to claim 8, wherein the at least one semiconductor device is an input/output device.

12. The computer system according to claim 8, wherein the semiconductor device further comprises a thermal transfer device for enhancing thermal dissipation capabilities of the semiconductor device.

13. The computer system according to claim 12, wherein the thermal transfer device comprises a heat slug proximate to a second surface of the integrated circuit for conducting heat from the integrated circuit and a heat sink for dissipating the heat.

14. The computer system according to claim 8, wherein the thermal conducting material is selected from a group consisting of diamond particles, alumina, aluminum nitride, beryllium oxide and quartz.

15. The computer system according to claim 7, wherein the layer of thermally conducting material is less than or equal to ten millimeters in thickness.

16. The computer system according to claim 7, wherein the package includes a Ball Grid Array package.

* * * * *